United States Patent [19]

Parthasarathi

[11] Patent Number: 4,692,221
[45] Date of Patent: Sep. 8, 1987

[54] IN-SITU DENDRITIC TREATMENT OF ELECTRODEPOSITED FOIL

[75] Inventor: Arvind Parthasarathi, Hamden, Conn.

[73] Assignee: Olin Corporation, New Haven, Conn.

[21] Appl. No.: 944,776

[22] Filed: Dec. 22, 1986

[51] Int. Cl.$^4$ ................................................. C25D 1/04
[52] U.S. Cl. ........................................ 204/13; 204/216
[58] Field of Search .................... 204/13, 216, 228, 231

[56] References Cited

U.S. PATENT DOCUMENTS

| | | | |
|---|---|---|---|
| Re. 30,180 | 12/1979 | Wolski et al. ........................ | 428/601 |
| 880,484 | 2/1908 | Edison .................................. | 204/13 |
| 1,417,464 | 5/1922 | Edison .................................. | 204/13 |
| 3,220,897 | 11/1965 | Conley et al. ........................ | 428/606 |
| 3,293,109 | 12/1966 | Luce et al. ........................... | 428/556 |
| 3,461,046 | 8/1969 | Clancy ................................. | 204/13 |
| 3,674,656 | 7/1972 | Yates .................................... | 204/13 |
| 3,799,847 | 3/1974 | Vladimirovna et al. ............. | 204/13 |
| 3,857,681 | 12/1974 | Yates et al. .......................... | 428/554 |
| 3,901,785 | 8/1975 | Vladimirovna et al. ........... | 204/208 |
| 3,918,926 | 11/1975 | Wolski et al. ........................ | 428/601 |
| 4,053,370 | 10/1977 | Yamashita et al. ................... | 204/13 |
| 4,468,293 | 8/1984 | Polan et al. .......................... | 204/27 |
| 4,490,218 | 12/1984 | Kadija et al. ......................... | 204/13 |
| 4,515,671 | 5/1985 | Polan et al. .......................... | 204/228 |
| 4,549,940 | 10/1985 | Karwan ................................ | 204/13 |
| 4,551,210 | 11/1985 | Parthasarathi ....................... | 204/28 |

FOREIGN PATENT DOCUMENTS

| | | | |
|---|---|---|---|
| 112145 | 3/1975 | German Democratic Rep. ... | 204/28 |
| 37-18870 | 12/1962 | Japan .................................... | 204/13 |
| 1543301 | 4/1979 | United Kingdom .................. | 204/13 |
| 1546047 | 5/1979 | United Kingdom .................. | 204/13 |
| 1548550 | 7/1979 | United Kingdom .................. | 204/13 |

*Primary Examiner*—T. M. Tufariello
*Attorney, Agent, or Firm*—Paul Weinstein

[57] ABSTRACT

The present invention relates to a process and apparatus for forming in situ surface treated metal foil. The apparatus includes a cathode and anode arranged and/or shaped to define a plating region characterized by a first zone having a first interelectrode gap and a second zone having a second interelectrode gap smaller than the first interelectrode gap. It has been found that by providing such an arrangement it is possible to generate in the first zone a localized current density below the limiting current density sufficient to plate metal foil onto the cathode and to simultaneously generate in the second zone a localized current density above the limiting current density sufficient to form dendrites on the freshly produced foil.

17 Claims, 5 Drawing Figures

IN-SITU DENDRITIC TREATMENT OF ELECTRODEPOSITED FOIL

The present invention relates to a process and apparatus for forming in-situ surface treated metal foil, particularly surface treated copper foil.

The bulk of the copper foil used in the printed circuit board industry is electrodeposited foil. The basic technology employed in forming electrodeposited foil has not changed greatly over the years. Generally, electrodeposited copper foil is formed by at least partially immersing a rotating drum cathode in an electrolyte containing copper ions. An anode formed from a plurality of arcuate sections of electrically conductive material is also immersed in the electrolyte. The anode and rotating drum cathode define a substantially constant interelectrode gap. Copper foil is formed on the rotating drum cathode by applying a current having a current density lower than the limiting current density of the electrolyte to the anode and the cathode. The electrodeposited foil is continually removed from the cathode as it emerges from the electrolyte solution so as to permit continuous foil production. U.S. Pat. Nos. 880,484 to Edison, 1,417,464 to Edison, and 3,461,046 to Clancy and U.K. Patent No. 1,546,047 illustrate systems for producing electrodeposited foil.

When used for printed circuit boards, the electrodeposited copper foil is bonded to a dielectric substrate. Bare electrodeposited copper foil exhibits poor adhesion properties because of its relatively smooth surfaces. To improve the adhesion properties of the foil and to form improved mechanical bonds between the foil and the substrate, a surface treatment is applied to the foil. This surface treatment generally comprises a layer of dendritic copper or copper oxide particles. U.S. Pat. No. 3,220,897 to Conley et al. illustrates one such surface treatment for copper foil.

The dendritic structures formed by some surface treatments such as Conley et al.'s tend to be very powdery and columnar. As a result, they break off during subsequent laminating and circuit fabrication steps, thereby reducing the degree of adhesion between the foil and the substrate. Multi-layer surface treatments have been developed in response to this problem. These treatments include a first step during which a layer of copper or copper oxide dendrites is formed on the foil and a subsequent step during which an overlayer known as a locking layer is formed over the dendritic layer. The locking layer is typically a smooth metal deposit which conforms to the shape of the dendritic layer. Its function is to reduce the powder transfer characteristics of the dendritic layer and to maintain the configuration of the dendritic surface projections intact during the subsequent lamination and circuit fabrication steps. U.S. Pat. Nos. 3,293,109 to Luce et al., 3,857,681 to Yates et al., and 3,918,926 to Wolski et al. and Re. Pat. No. 30,180 to Wolski et al. illustrate multi-layer surface treatments which have been commercially used.

Multi-layer surface treatments often require passage of the foil being treated through a series of treatment tanks. Electrodeposited foil is relatively thin and tends to be delicate. The handling associated with passing the foil through a series of treatment tanks can often damage the foil. U.S. Pat. Nos. 4,468,293 and 4,515,671, both to Polan et al., illustrate a simpler technique for applying a surface treatment to copper foil. In this technique, copper foil to be treated is electrically connected as a cathode and immersed in a copper containing electrolyte. A non-zero base pulsed cathodic current having a first portion during which the applied current density exceeds the limiting current density of the electrolyte and a second portion during which the applied current density is lower than the limiting current density is applied to the foil. During each pulse cycle, copper dendrites are formed on the foil during the first portion and bonded to the foil during the second portion. In addition to being simpler, this technique applies a treatment which exhibits adhesion properties better than those of commercially available multi-layer treatments. U.S. Pat. No. 4,549,940 to Karwan illustrates a similar approach for applying a surface treatment to copper foil.

Still other approaches for applying a surface treatment to copper foil are illustrated in U.S. Pat. No. 4,551,210 to Parthasarathi and East German Patent Publication No. 112,145. The Parthasarathi approach employs one or more anodes positioned at an angle with respect to the foil being treated and a single current source to form and bond a layer of dendrites to a surface of the foil. Each treatment anode is arranged so as to form a progressively increasing interelectrode gap with the foil. The approach utilized in the East German Patent Publication includes a plurality of background anodes and a plurality of treatment anodes immersed in an electrolyte through which a preformed copper foil passes.

As previously mentioned, one of the problems associated with prior art treatment systems is the need to pass the foil through a series of treatment tanks. While it is desirable from a commercial standpoint to perform the surface treatment in-line with the foil formation process, it is generally impractical to do so because foil production line speeds are not compatible with treatment line speeds. Typical line speeds for foil treatment lines are in the range of 15–20 ft/min, whereas line speeds for electrodeposited foil production lines are generally in the range of 2–4 ft/min. In situ dendritic treatment of electrodeposited foil thus becomes very appealing from an efficiency standpoint.

Conventional systems for applying an in situ dendritic treatment to electrodeposited foil generally have one or more treatment anodes in addition to one or more primary anodes. The treatment anodes and the primary anodes are arranged within an electrochemical cell to define a substantially constant interelectrode gap with the plating surface of a rotating drum cathode. Simultaneous foil deposition and treatment is achieved by connecting the primary anode(s) and the treatment anode(s) to separate power supplies and applying currents having different current densities to each type of anode. U.S. Pat. Nos. 3,674,656 to Yates, 3,799,847 to Vladimirovna et al., 3,901,785 to Vladimirovna et al., 4,053,370 to Yamashita et al., and 4,490,218 to Kadija et al. and U.K. Patent Nos. 1,543,301 and 1,548,550 illustrate some of the systems known in the art for forming in situ surface treated electrodeposited foil.

Japanese Patent Publication No. 37-18870 illustrates still another approach for forming electrodeposited copper foil having a roughened surface. In this approach, the surface of freshly formed foil is roughened by the generation of hydrogen within the electroforming cell.

The present invention relates to a relatively simple electrolytic approach for producing in situ surface treated metal foil. In this approach, the interelectrode gap which exists between an anode and a cathode mounted in an electrolytic cell is adjusted to provide different localized current densities such that in a first zone the current density is well below the limiting current density while in a second zone the current density exceeds the limiting current density. By providing such an interelectrode gap, metal foil is electroformed on the cathode in the first zone and a dendritic treatment is applied to the foil in the second zone. In a preferred embodiment, the first zone extends over the bulk of the plating region while the second zone is adjacent the exit end of the interelectrode gap or plating region. One of the advantages of the present invention is that foil formation and treatment can be accomplished utilizing only one power supply.

In accordance with the present invention, the non-uniform interelectrode gap is defined by a rotating drum cathode and an anode shaped and/or positioned with respect to the cathode to define the first and second zones. The anode may comprise either a plurality of shaped or curved sections mounted within the cell concentrically with respect to the cathode. Alternatively, the anode may comprise a plurality of curved sections mounted in the cell eccentrically with respect to the cathode. In still another embodiment, the anode has a strip of electrically conductive material mounted to one of its surface for defining the zone in which the surface treatment is applied.

Accordingly, it is an object of the present invention to provide a relatively simple process and apparatus for forming in situ surface treated metal foil.

It is a further object of the present invention to provide metal foil suitable for use in printed circuit board and other electrical and electronic applications.

These and other objects and advantages will become more apparent from the following description and drawings in which like reference numerals depict like elements.

In accordance with the present invention, a process and apparatus are described for forming surface treated metal foil, particularly copper foil, having improved adhesion properties. The process described herein has the virtue of being relatively easy to perform. While the present invention will be described in the context of forming treated copper foil for use in electrical and electronic applications, it should be recognized that it has wider applicability. Surface treated metal foils other than copper foil may be formed using the process and apparatus of the present invention. As used herein, the term foil may also be used to refer to electrodeposited sheet and strip material.

Figure 1:
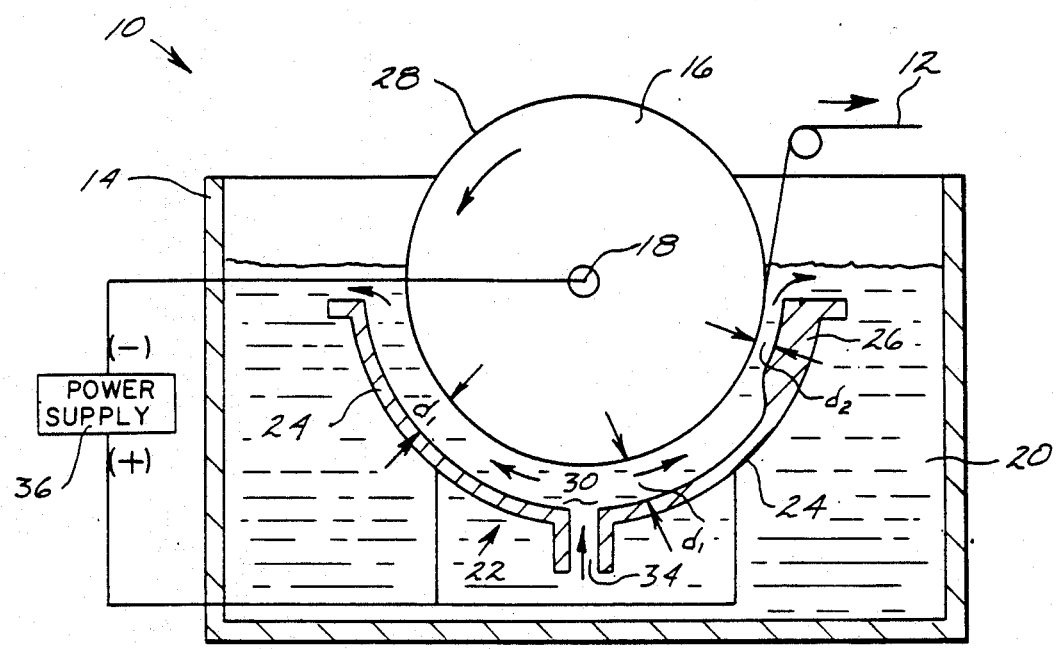
FIG. 1 illustrates a cross sectional view of an electrolytic apparatus for forming in situ surface treated metal foil.

Referring now to FIG. 1, an electrolytic or electrochemical cell 10 for forming surface treated metal foil 12 is illustrated. The cell 10 includes a tank 14 formed from a suitable inert material such as lead, stainless steel, polypropylene, polyvinylchloride, concrete or rubber. If desired, the tank may be lined with an appropriate electrically non-conductive material not shown.

The cell 10 further includes a moving cathode such as a rotating drum cathode 16. The cathode 16 is mounted in the tank 14 in a manner which permits it to rotate about its central axis 18. The drum cathode 16 is also mounted in the tank so that it is at least partially immersed within an electrolyte solution 20. In a preferred arrangement, about half of the drum cathode 16 extends beneath the surface of the electrolyte. Any suitable conventional mounting devices (not shown) known in the art may be used to mount the cathode 16 within the tank. In addition, a suitable motor drive arrangement not shown for driving the cathode may be provided. Any conventional motor drive system known in the art may be used to rotate the cathode 16 about the axis 18.

The drum cathode 16 may be formed from any electrically conductive metal or metal alloy including but not limited to lead, stainless steel, columbium, tantalum, titanium, and alloys thereof. In a preferred construction, the cathode 16 comprises a stainless steel drum having a polished plating surface formed from titanium, columbium, tantalum, or an alloy thereof.

The electrolyte 20 generally comprises an acidic solution containing a concentration of ions of a metal to be plated. An aqueous copper sulfate-sulfuric acid solution has been found to be useful as an electrolyte for forming surface treated copper foil. This copper sulfate-sulfuric acid solution preferably contains a copper concentration in the range of from about 10 grams/liter, hereinafter g/l, to about 60 g/l and a concentration of sulfuric acid up to about that which causes copper to precipitate out as copper sulfate. This solution may be used either at room temperature or at a slightly elevated temperature. When used at room temperature, it is most preferred that the copper concentration be in the range of from about 15 g/l to about 40 g/l and that the sulfuric acid concentration be in the range of from about 10 g/l to about 100 g/l. If desired, a proteinaceous material such as gelatin and/or a suitable surfactant such as lauryl sulfate may be added to the electrolyte to further facilitate the surface treatment process.

If needed, the cell 10 may contain a heating/cooling loop not shown for maintaining the electrolyte at a desired temperature. Any suitable heating/cooling loop known in the art may be used. It should of course be recognized that the foregoing copper and sulfuric acid concentrations are temperature dependent. For temperatures other than room temperature, the concentrations may have to be adjusted to slightly higher levels.

The cell 10 further includes an anode shaped and/or positioned to perform the technique of the present invention. The anode 22 differs from conventional anodes in that it is shaped to define with the rotating drum cathode 16 a plating region having a non-uniform interelectrode gap 30. The plating region is substantially coextensive with the portion of the cathode 16 immersed in the electrolyte 20.

The anode 22 has a first portion 24 defining a first interelectrode gap $d_1$ with the plating surface 28 of the cathode. The first portion preferably extends over the bulk of the plating region. The anode 22 further has a second portion 26 defining a second interelectrode gap $d_2$ with the plating surface 28. The second gap $d_2$ is significantly smaller than the first gap $d_1$. The reason why the second gap $d_2$ is smaller than the gap $d_1$ is to take advantage of the discovery that for a given applied potential, the localized current density is a function of the resistance of the electrolyte solution and the interelectrode gap. Thus for a given potential and electrolyte solution, one can simultaneously plate foil and form a plurality of dendrites thereon merely by utilizing certain interelectrode gaps.

Figure 2:
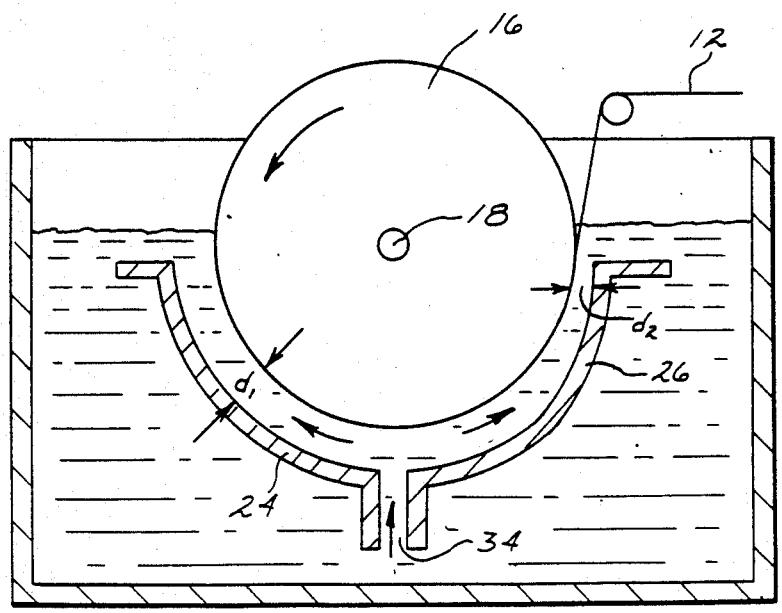
FIGS. 2-5 illustrate alternative embodiments of the apparatus of the present invention.
Figure 3:
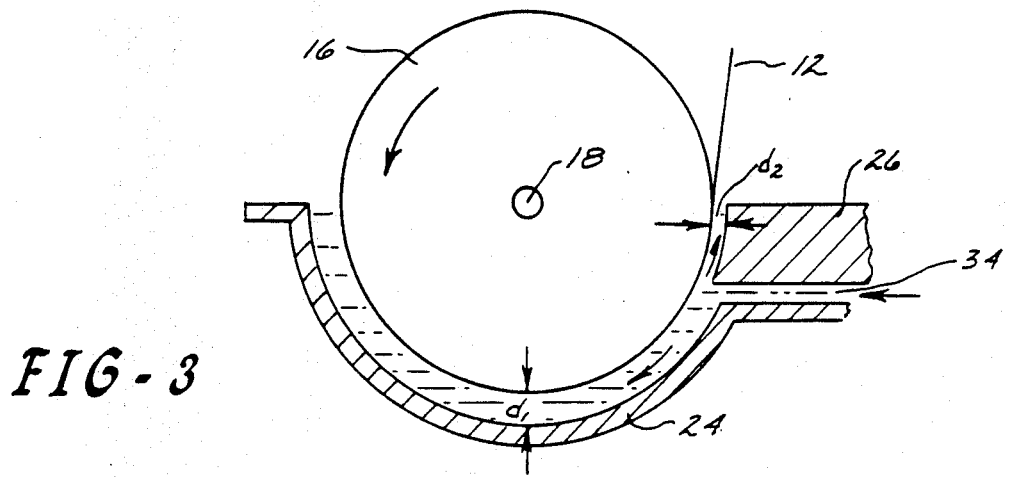

The anode 22 may be either a unitary structure or a plurality of spaced apart sections such as those shown in the embodiments of FIG. 1–3. As shown in these Figures, the various anode sections may have a variety of curved shapes. Preferably, these shaped anode sections are mounted within the tank 14 so as to be concentric with the cathode 16 and its axis 18. In a preferred arrangement, the anode sections are separated by a conduit 34 for permitting electrolyte to flow into the interelectrode gap 30 between the anode 22 and the cathode 16.

The conduit 34 is preferably centrally positioned within the cell 10 and communicates with a suitable pumping device not shown for creating a flow of electrolyte at a desired flow rate into the interelectrode gap. Suitable flow rates are in the range of from about 1 m/sec to about 4 m/sec, preferably from about 1 m/sec to about 2.5 m/sec. If desired, the conduit 34 may be located at some non-central location such as that shown in FIG. 3, i.e. one near the exit portion of the plating region.

A current source 36 is provided to apply a given potential across the cathode 16 and the anode 22. Any suitable AC or DC power supply known in the art may be used for the current source 36.

As previously mentioned, the present invention makes use of the discovery that the localized current density (I) is a function of the applied potential across the electrodes (V), the specific resistance (p) of the solution, and the interelectrode gap (d). The relationship may be expressed as follows:

$$d = V/Ip$$

Thus, if one knows empirically or otherwise the limiting current density and the resistance of an electrolyte solution, one can generate a localized current density either above or below the limiting current density merely by adjusting the interelectrode gap. The interelectrode gap $d_1$ in each of the illustrated apparatusses is large enough that the localized current density is below the limiting current density, thereby permiting a relatively smooth deposit to be formed on the plating surface 28 of the cathode 16. This relatively smooth deposit forms the foil to be treated. The second interelectrode gap $d_2$ on the other hand is sufficiently small that the localized current density exceeds the limiting current density and thus a plurality of dendritic structures are formed on the foil.

In operation, the rotating drum cathode 16 is rotated at a desired speed and a desired electrolyte flow rate is established within the interelectrode gap 30. A potential is applied across the cathode 16 and the anode 22 by the current supply 36. The applied potential causes a localized current density below the limiting current density to be generated in the first zone and a localized current density above the limiting current density to be generated in the second zone. As a result, metal foil is continually electroformed on the plating surface of the cathode in the first zone and a plurality of dendritic structures are formed on and bonded to the foil in the second zone. As the treated foil emerges from the electrolyte solution, it is removed from the cathode 16. Any suitable means (not shown) known in the art such as a knife blade may be used to remove or strip the foil from the cathode.

After removal from the cathode, the foil may be rinsed, dried, slit to size, rolled onto a take-up reel not shown, and subjected to one or more additional treatments, such as an anti-tarnishing treatment wherein the treated foil is immersed in a chromic acid and/or phosphoric acid solution. If desired, the additional treatment(s) may be done in-line with the treated foil producing apparatus.

The treated foil thus produced may be laminated to an appropriate substrate. The particular substrate to be used depends upon the intended application and service conditions. Some of the potential substrate materials include polytetrafluoroethylene impregnated fiberglass, polyimides, fiberglass impregnated by certain fluorocarbon products including polymers of trifluorochloroethylene and certain copolymers and the like. If needed, an adhesive may be used to bond the treated foil to the substrate. Any suitable technique known in the art may be used to bond the treated foil to the substrate.

Figure 4:
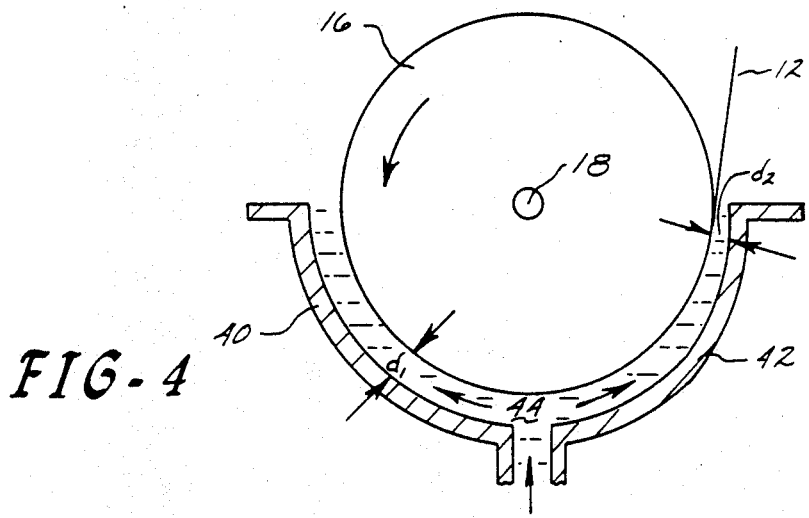

While it is preferred to perform the present invention by utilizing shaped anodes mounted concentric with a rotating drum cathode, it is also possible to produce in situ surface treated metal foil utilizing an anode mounted eccentrically with respect to the cathode. Such an arrangement is illustrated in FIG. 4. While the anode sections 40 and 42 are each curved to form an anode having a substantially semi-cylindrical configuration, they are mounted in the tank eccentrically with respect to the rotating drum cathode 16 so that the interelectrode gap 44 is widest at the entrance side of the interelectrode gap and narrowest at the exit side of the gap. The narrow gap will cause the current density to be locally higher.

Figure 5:
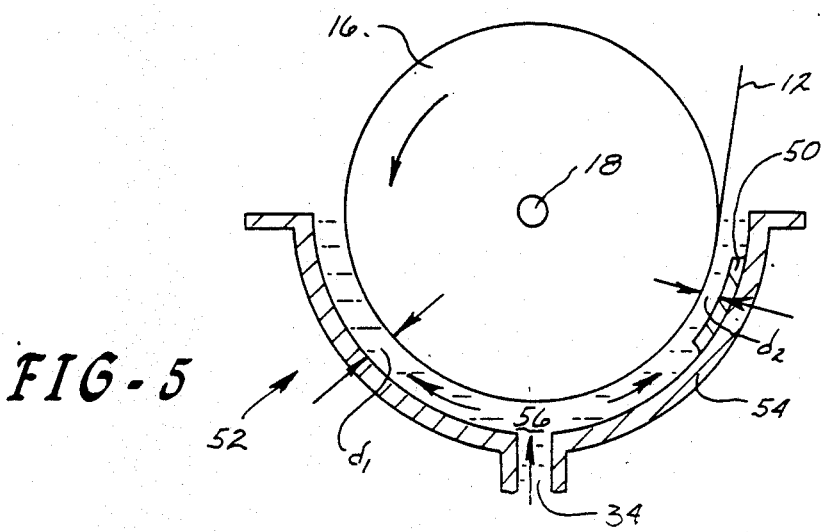

FIG. 5 represents another embodiment of an apparatus for performing the process of the present invention. In this embodiment, the interelectrode gap is narrowed or adjusted by mounting an extra strip 50 of anode material to a semi-cylindrical anode construction forming a base portion 52. The strip 50 may be formed from any suitable electrically conductive material and may be mounted on the anode section 54 in any desired manner. In addition, the strip 50 may have any desired shape for narrowing the interelectrode gap 56. As before, a potential is applied across the cathode 16 and the anode 52 having the strip 50 mounted thereto. This again creates a first zone in which the localized current density is below the limiting current density and a second zone in which the localized current density is above the limiting current density. As before, metal foil will be electroformed in the first zone and treated in the second zone to improve its adhesion properties.

While the strip 50 has been illustrated in FIG. 5 as being positioned adjacent the exit end of the interelectrode gap, it could also be positioned closer to the central manifold 34. One advantage to doing this is that after the dendrites are formed at the narrow gap in the second zone, a third zone having an increased interelectrode gap can be provided. The increase in the interelectrode gap in this third zone could decrease the current sufficiently to form a smooth adherent layer over the dendrites should such a layer be needed. This deposit would conform to the shape of the rough dendritic surface and would serve to decrease the powder transfer characteristics of the dendrites.

While the present invention has been described in connection with the production of surface treated copper foil, the broad technique described herein is equally applicable to the formation of other treated metals including but not limited to lead, tin, zinc, iron, nickel, gold, and silver. Of course, the type of electrolyte, the flow rate, and the applied current densities will have to be altered in accordance with the metal being plated and treated.

While the cathode for the plating apparatus has been described as being a rotating drum cathode, it possible to perform the present invention using other types of cathodes. For example, the cathode could be an endless belt formed from an electrically conductive material or could be a carrier strip formed from an electrically conductive material such as aluminum or an aluminum alloy.

The patents and foreign patent publications set forth in the specification are intended to be incorporated by reference herein.

It is apparent that there has been provided in accordance with this invention an in situ treatment of electrodeposited foil which fully satisfies the objects, means, and advantages set forth hereinbefore. While the invention has been described in combination with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

What is claimed:

1. An apparatus for forming in-situ surface treated metal foil, said apparatus comprising:
   a cell containing an electrolyte having a concentration of metal values to be plated;
   a moving cathode at least partially immersed in said electrolyte;
   means for electroforming metal foil on said cathode in a first zone and for applying a surface treatment comprising a plurality of dendritic structures to said foil in a second zone;
   said electroforming and surface treatment applying means comprising an anode having a first portion spaced a first distance from said cathode and defining said first zone and a second portion spaced a second distance from said cathode and defining said second zone; and
   said second distance being sufficiently small to create a localized current density sufficient to form said dendritic structures on said foil.

2. The apparatus of claim 1 further comprising:
   said anode being shaped to define said first and second portions.

3. The apparatus of claim 2 further comprising:
   said cathode comprising a drum cathode mounted for rotation about an axis; and
   said anode being positioned within said cell concentrically with respect to said cathode.

4. The apparatus of claim 2 further comprising:
   said anode being formed from a plurality of curved structures; and
   said curved structures being separated by at least one conduit for permitting electrolyte to flow between said cathode and said anode.

5. The apparatus of claim 1 further comprising:
   said cathode comprising a drum cathode mounted for rotation about an axis; and
   said anode being positioned within said cell eccentrically with respect to said cathode.

6. The apparatus of claim 5 further comprising:
   said anode being formed from a plurality of curved structures; and
   said curved structures being separated by at least one conduit for permitting electrolyte to flow between said anode and said cathode.

7. The apparatus of claim 1 further comprising:
   said anode having a curved base portion defining said first zone and a second portion mounted to a surface of said base portion and defining said second zone.

8. The apparatus of claim 7 further comprising:
   said curved base portion comprising a plurality of arcuate structures; and
   said arcuate structures being separated by at least one conduit for permitting electrolyte to flow between said anode and cathode.

9. The apparatus of claim 1 further comprising:
   means for applying a single potential across said cathode and said anode.

10. An apparatus for forming in situ surface treated metal foil comprising:
    an anode and a moving cathode having a plating surface;
    said anode and said cathode being spaced apart and defining a plating region characterized by a non-uniform interelectrode gap;
    said plating region including a first zone having a first interelectrode gap and a second zone having a second interelectrode gap less than said first interelectrode gap; and
    means for applying a potential across said anode and cathode so as to form a relatively smooth metal deposit on said plating surface in said first zone and apply a surface treatment comprising a plurality of dendrites to said relatively smooth metal deposit in said second zone.

11. A process for forming in-situ surface treated metal foil, said process comprising:
    providing a tank having an electrolyte solution containing a plurality of metal values to be plated;
    at least partially immersing an anode and a cathode having a plating surface in said electrolyte solution;
    said immersing step including positioning said anode and said cathode in said tank so as to define a plating region therebetween having a first zone with a first interelectrode gap and a second zone having a second interelectrode gap less than said first interelectrode gap; and
    applying a potential across said anode and cathode so as to form a relatively smooth deposit on said plating surface in said first zone and forming a plurality of dendrites on said smooth deposit in said second zone.

12. The process of claim 11 further comprising:
    said potential applying step creating a first localized current density lower than the limiting current density of said electrolyte in said first zone and a second localized current density greater than the limiting current density in said second zone.

13. The process of claim 12 further comprising:
    applying said potential from a single power supply.

14. The process of claim 11 wherein said anode and cathode positioning step comprises mounting said anode in said tank concentrically with respect to said cathode.

15. The process of claim 11 wherein said anode and cathode positioning step comprises mounting said anode in said tank eccentrically with respect to said cathode.

16. The process of claim 11 wherein said positioning step comprises:
providing a shaped anode construction; and
mounting said anode in said tank so as to form said plating region having said first and second interelectrode gaps.

17. The process of claim 11 wherein said positioning step comprises:
providing an anode having a semi-cylindrically shaped base portion and a strip of electrically conductive material mounted to a surface of said base portion; and
mounting said anode in said tank so that said base portion forms with said cathode said first interelectrode gap and said strip forms with said cathode said second interelectrode gap.

* * * * *